(12) United States Patent
Srinivas et al.

(10) Patent No.: US 10,439,620 B2
(45) Date of Patent: Oct. 8, 2019

(54) DUAL-PFD FEEDBACK DELAY GENERATION CIRCUIT

(71) Applicant: TEXAS INSTRUMENTS INCORPORATED, Dallas, TX (US)

(72) Inventors: Theertham Srinivas, Karnataka (IN); Jagdish Chand Goyal, Karnataka (IN); Peeyoosh Mirajkar, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/715,151

(22) Filed: Sep. 25, 2017

(65) Prior Publication Data

US 2018/0091157 A1    Mar. 29, 2018

(30) Foreign Application Priority Data

Sep. 23, 2016   (IN) .............................. 201641032526

(51) Int. Cl.
*H03L 7/087*   (2006.01)
*H03L 7/197*   (2006.01)
*H03L 7/193*   (2006.01)

(52) U.S. Cl.
CPC .............. *H03L 7/087* (2013.01); *H03L 7/193* (2013.01); *H03L 7/1974* (2013.01); *H03L 7/1976* (2013.01); *H03L 2207/10* (2013.01)

(58) Field of Classification Search
CPC ... H03L 7/00; H03L 7/08; H03L 7/085; H03L 7/087; H03L 7/16; H03L 7/18;
(Continued)

(56) References Cited

U.S. PATENT DOCUMENTS 8,754,713 B2 * 6/2014 Uozumi ................. H03K 5/135
    327/156
9,018,988 B2 * 4/2015 Abdel-Haleem ....... H03L 7/193
    327/115
9,520,889 B2 * 12/2016 Unruh ................... H03L 7/1974

* cited by examiner

*Primary Examiner* — Lincoln D Donovan
*Assistant Examiner* — Diana J. Cheng
(74) *Attorney, Agent, or Firm* — Andrew Viger; Charles A. Brill; Frank D. Cimino

(57) ABSTRACT

A dual-PFD circuit with delay feedback generated by a dual-modulus prescaler based on mode control from a feedback delay generation circuit. The PFD circuit can be used with a PLL feedback divider to divide a VCO clock signal VCO_clk and generate FB and FB_DLY signals. The PLL feedback divider includes a dual modulus prescaler to selectively divide the VCO_clk by either M or M+1 (such as 4/5) based on a divide mode control input to generate a prescaled divide signal, and a programmed counter/divider (N counter/1/N divider) to selectively divide the prescaled divide signal to generate the FB signal, and a delay generation circuit to selectively delay the FB signal by a pre-defined delay to generate the FB_DLY signal. The prescaler is responsive to the pre-defined delay from the delay generation circuit to change divide modes. The dual PFD circuit response to the FB and FB_DLY signals in relation to a reference signal to generate a phase comparison signal. the dual-PFD circuit can be used with a charge-pump coupled to the dual PFD circuit, and responsive the phase comparison signal to generate a frequency tuning voltage, for input to a VCO for generating the VCO clock signal. The dual PFD circuit, charge pump and VCO can be used in a PLL frequency synthesizer.

17 Claims, 5 Drawing Sheets

(58) Field of Classification Search
CPC ..... H03L 7/197; H03L 7/1972; H03L 7/1974; H03L 7/1976; H03L 7/1978
USPC .................................................. 327/156–158
See application file for complete search history.

DUAL-PFD FEEDBACK DELAY GENERATION CIRCUIT

CROSS-REFERENCE TO RELATED APPLICATIONS

Priority is claimed under 37 CFR 1.78 and 35 USC 119(e) to INDIA Provisional Application 2016\41032526, filed 2016 Sep. 23), which is incorporated by reference.

BACKGROUND

Technical Field

This Patent Disclosure relates to frequency synthesizers using dual-PFD, and more particularly including a feedback divider with dual-modulus pre-scaler.

Related Art

A PLL (phase locked loop) frequency synthesizer, such as for synthesizing RF frequencies, includes a PFD (phase/frequency detector), a loop filter, a VCO (voltage or otherwise controlled oscillator), and a PLL feedback loop with a PLL feedback divider. A charge-pump CP-PLL includes a charge-pump controlled by the PFD (UP/DN current pulses).

The PFD compares a reference frequency fref to a PLL feedback frequency fbk, corresponding to the PLL output frequency fo divided by the PLL feedback divider, and generates a PFD error signal proportional to the phase difference between fref and fbk. For a CP-PLL, the PFD error signal in the form of UP/DN current pulses are input to the CP, with the CP current output converted by the loop filter (such as second order low pass) to a tuning/control voltage for input to the VCO. In response to the tuning control voltage, the VCO generates the PLL output frequency fo.

For a CP-PLL, a dual-PFD can be used to linearize the charge pump transfer function, providing dynamic matching between UP/DN current pulses, and increasing gain to improve overall in-band noise performance. A dual PFD requires in addition to the PLL feedback signal, a delayed PLL feedback signal, with a fixed delay.

The PLL divider in the PLL feedback loop functions as a frequency multiplier to provide output frequency scaling including channel spacing. To set frequency scaling/multiplication, the PLL divider can be implemented with a programmable counter/divider, which can be referred to as an N counter or 1/N divider (although the PLL divider can be either integer-N or fractional-N). For high PLL output frequencies, i.e., large frequency multiplications and feedback divisions, the programmable counter can be preceded by a fixed prescaler counter/divider to bring the PLL output frequency down to a lower-frequency, operating range for the programmable counter/divider. To maintain channel spacing (resolution), a dual-modulus prescaler provides two separate division modes M/M+1 (such as 4/5), selectable by a mode control input.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for a dual-PFD with delay feedback generated by a dual-modulus prescaler based on mode control from a delay generation circuit, such as can be used in a PLL frequency synthesizer.

According to aspects of the Disclosure, a dual-PFD circuit with delay feedback generated by a dual-modulus prescaler based on mode control from a feedback delay generation circuit. The PFD circuit can be used with a PLL feedback divider to divide a VCO clock signal VCO_clk and generate FB and FB_DLY signals. The PLL feedback divider includes a dual modulus prescaler to selectively divide the VCO_clk by either M or M+1 (such as 4/5) based on a divide mode control input to generate a prescaled divide signal, and a programmed counter/divider (N counter/1/N divider) to selectively divide the prescaled divide signal to generate the FB signal, and a delay generation circuit to selectively delay the FB signal by a pre-defined delay to generate the FB_DLY signal. The prescaler is responsive to the pre-defined delay from the delay generation circuit to change divide modes. The dual PFD circuit response to the FB and FB_DLY signals in relation to a reference signal to generate a phase comparison signal. the dual-PFD circuit can be used with a charge-pump coupled to the dual PFD circuit, and responsive the phase comparison signal to generate a frequency tuning voltage, for input to a VCO for generating the VCO clock signal. The dual PFD circuit, charge pump and VCO can be used in a PLL frequency synthesizer.

Other aspects and features of the invention claimed in this Patent Document will be apparent to those skilled in the art from the following Disclosure.

DETAILED DESCRIPTION

This Description and the Drawings constitute a Disclosure for a dual-PFD with delay feedback generated by a dual-modulus prescaler based on mode control from a delay generation circuit, such as for use in a PLL frequency synthesizer, including describing design examples (example implementations), and illustrating various technical features and advantages.

In brief overview, a dual-PFD circuit with delay feedback generated by a dual-modulus prescaler based on mode control from a feedback delay generation circuit. The PFD circuit can be used with a PLL feedback divider to divide a VCO clock signal VCO_clk and generate FB and FB_DLY signals. The PLL feedback divider includes a dual modulus prescaler to selectively divide the VCO_clk by either M or M+1 (such as 4/5) based on a divide mode control input to generate a prescaled divide signal, and a programmed counter/divider (N counter/1/N divider) to selectively divide the prescaled divide signal to generate the FB signal, and a delay generation circuit to selectively delay the FB signal by a pre-defined delay to generate the FB_DLY signal. The prescaler is responsive to the pre-defined delay from the delay generation circuit to change divide modes. The dual PFD circuit response to the FB and FB_DLY signals in relation to a reference signal to generate a phase comparison signal. the dual-PFD circuit can be used with a charge-pump coupled to the dual PFD circuit, and responsive the phase comparison signal to generate a frequency tuning voltage, for input to a VCO for generating the VCO clock signal. The dual PFD circuit, charge pump and VCO can be used in a PLL frequency synthesizer.

Figure 1:
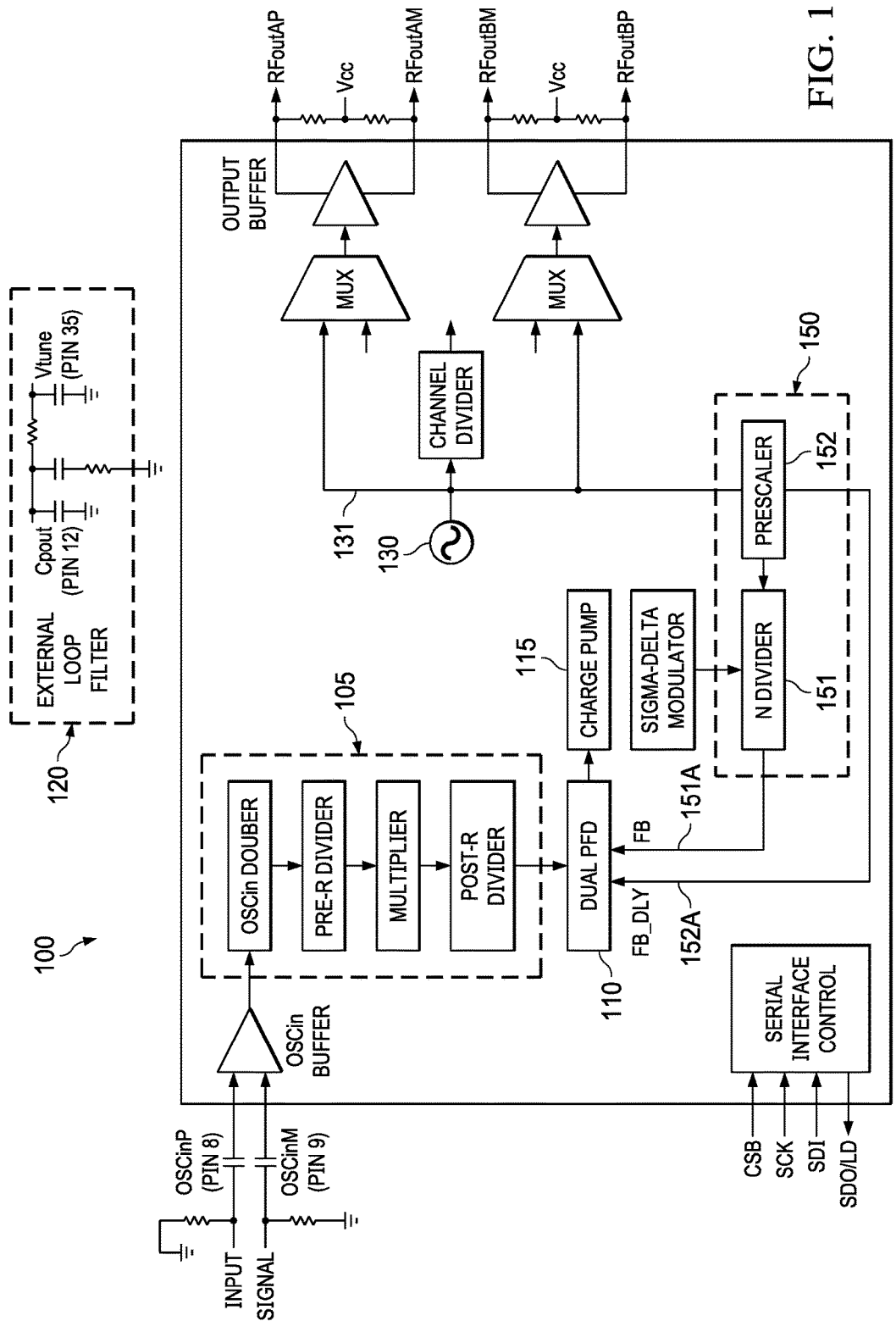
FIG. 1 illustrates an example PLL frequency synthesizer [100], including a dual PFD [110] driving a charge-pump [115] to provide a control voltage to a VCO [130], the CP-PLL including a feedback divider [150] with a dual-modulus prescaler [152] and feedback delay generation circuit to provide a feedback delay signal [152A] and prescaler mode control according to this disclosure.

FIG. 1 illustrates an example PLL frequency synthesizer 100, including a dual PFD 110 driving a charge-pump 115 to provide a control voltage to a VCO 130, the CP-PLL including a feedback divider 150 with a dual-modulus prescaler 152 and feedback delay generation circuit to provide a feedback delay signal 152A and prescaler mode control according to this disclosure.

Figure 2:
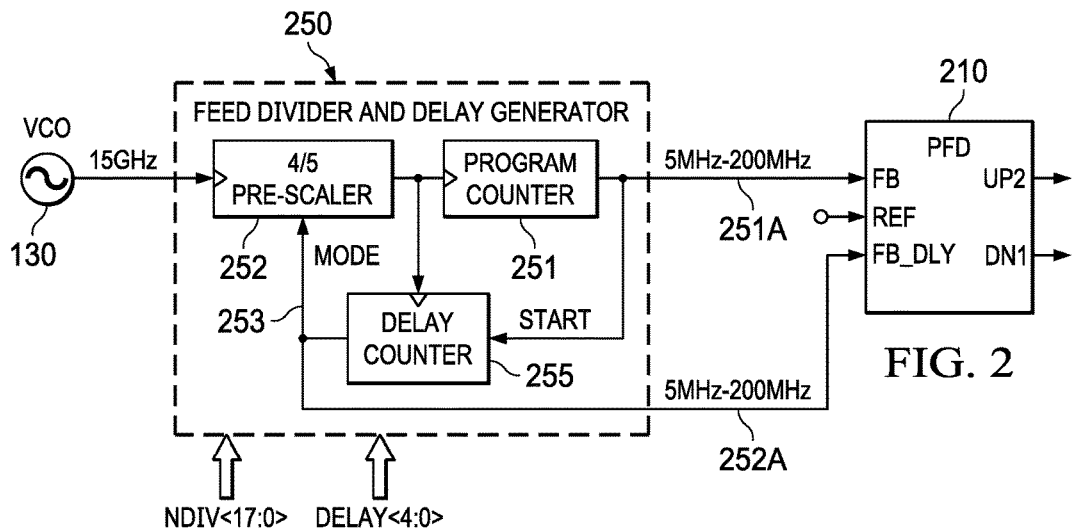
FIG. 2 illustrates an example PLL feedback divider [250] for use with a dual-PFD with delay feedback generated by a dual-modulus prescaler based on mode control from a feedback delay generation circuit, the PLL feedback divider including an example programmed N counter (1/N divider) [251] with an example dual-modulus (4/5) prescaler [252], and including a feedback delay counter circuit [255] that generates a feedback delay signal FB_DLY [252A] and a mode control bit [253].

FIG. 2 illustrates an example PLL feedback divider 250 for use with a dual-PFD with delay feedback generated by a dual-modulus prescaler based on mode control from a feedback delay generation circuit, the PLL feedback divider including an example programmed N counter (1/N divider) 251 with an example dual-modulus (M/M+1, for example 4/5) prescaler 252, and including a feedback delay counter circuit 255 that generates a feedback delay signal FB_DLY 252A and a mode control bit 253.

In the proposed solution the MODE control bit which triggers the "Div_by_5" mode of pre-scaler is supplied via Delay generation block instead of program counter. The feedback signal from program counter is used to start the DELAY counter [Delay generation block]. The Output of delay counter is used as Mode bit for pre-scaler. Thus until the Delay counter finishes its job of generating the delayed signal the pre-scaler division value is held at 'Div_by_4', which in turn ensure fixed delay irrespective of NDIV value. The Delay Counter produces a signal that is delayed by DELAY<4:0>*pre-scaler clock cycles. Integrating the Delay Counter into the Feedback divider so as to reduce the power consumption is the novelty of this solution.

In the proposed solution the MODE control bit which triggers the "Div_by_5" mode of pre-scaler is supplied via Delay generation block instead of program counter. The feedback signal from program counter is used to start the DELAY counter [Delay generation block]. The Output of delay counter is used as Mode bit for pre-scaler. Thus until the Delay counter finishes its job of generating the delayed signal the pre-scaler division value is held at 'Div_by_4', which in turn ensure fixed delay irrespective of NDIV value. The DELAY counter can be implemented using a pulse-swallow counter circuit.

Note that TON pulse width can vary, but implementing the PFD with positive edge triggered D Flip-Flop can avoid this issue.

Figure 3A:
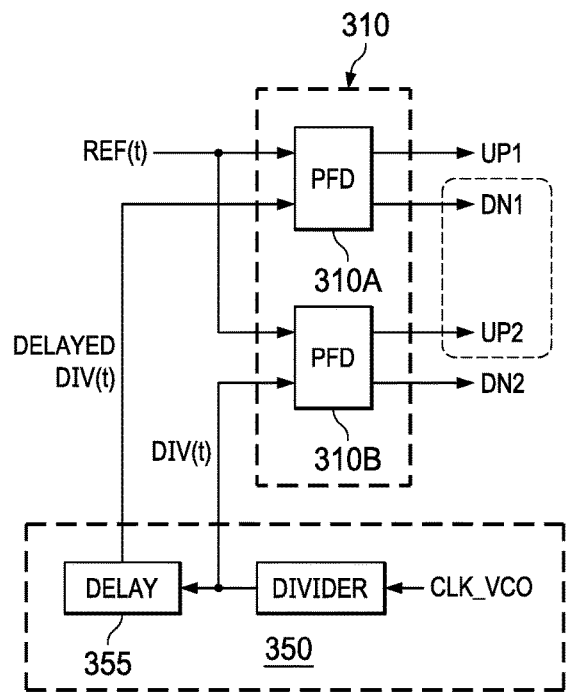
FIGS. 3A and 3B illustrate an example dual PFD [310], including FB div(t) and FB_DLY delayed_div(t) signals, input to respective PFD circuits [310A/310B], and illustrating PFD UP/DN output as UP2/DN1.
Figure 3B:
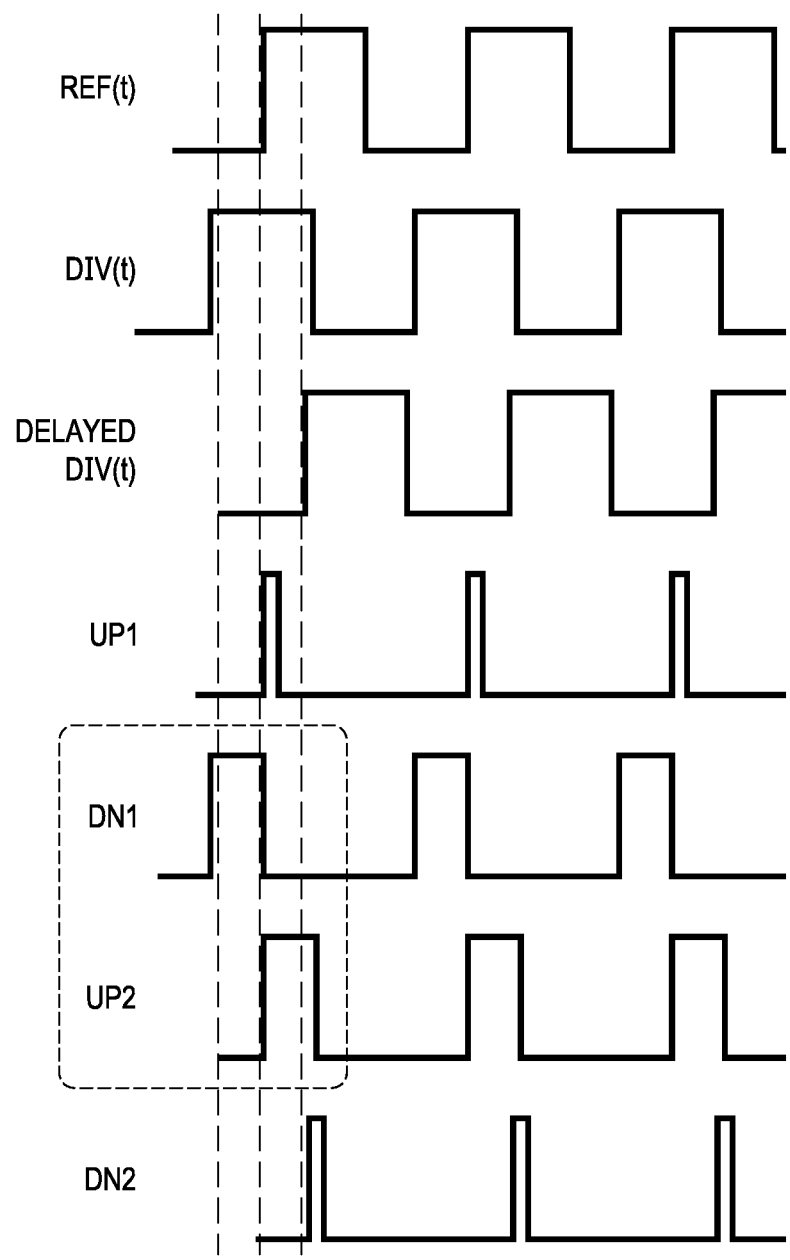

FIGS. 3A and 3B illustrate an example dual PFD 310, including FB div(t) and FB_DLY delayed_div(t) signals, input to respective PFD circuits 310A/310B, and illustrating PFD UP/DN output as UP2/DN1.

Two PFDs are used instead of one. One is fed with the feedback(FB) clock, the other with the delayed version of FB clock. UP2 & DN1 are fed to the Charge Pump. In the steady state, Ref clock settles in the middle of the feedback clocks.

A design goal is linearization of the PFD transfer function: Q=Idn(T+ΔT)−Iup(T−ΔT)=(Iup+Idn)*ΔT. Slope depends on (Iup+Idn) thus increasing the gain of charge pump.

Llinearized charge pump transfer function. Helps in getting 2× gain from same charge-pump current which improves the overall in-band noise performance of the RF Synthesizer. Note that noise performance is impacted by the FB_DLY delayed feedback signal, as well as the FB feedback signal.

Figure 4:
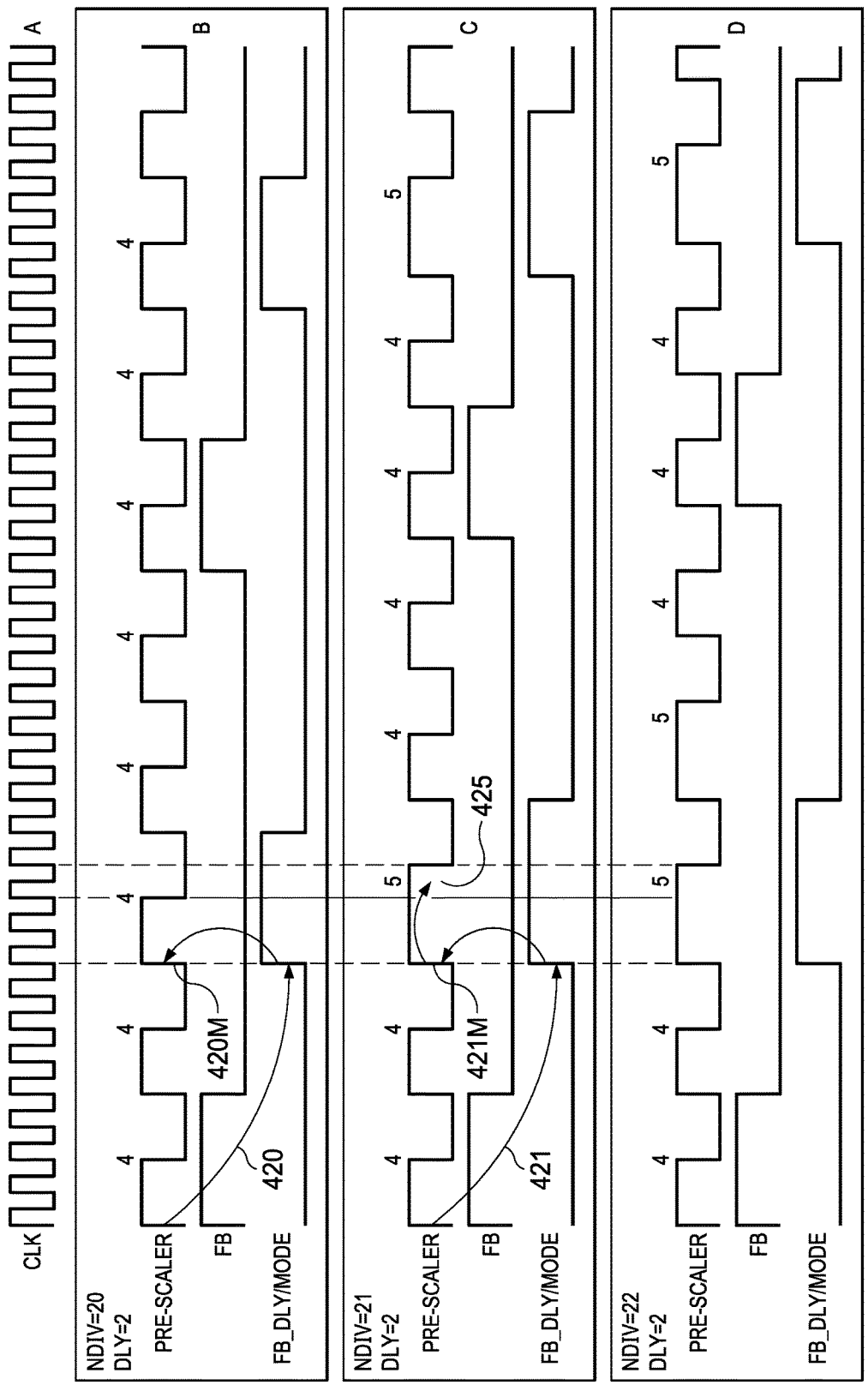
FIG. 4 are example waveforms for VCO_CLK [A], and Prescaler, FB and FB_DLY/MODE, for NDIV=20 (4-4-4-4-4) [B], NDIV=21 (4-4-5-4-4) [C], and NDIV=22 (4-4-5-5-4) [D], including illustrating generation of FB_DLY and the prescaler mode control.

FIG. 4 are example waveforms for VCO_CLK [A], and Prescaler, FB and FB_DLY/MODE, for NDIV=20 (4-4-4-4) [B], NDIV=21 (4-4-5-4-4) [C], and NDIV=22 (4-4-5-5-4) [D], including illustrating generation of FB_DLY and the prescaler mode control.

For feedback divider (NDIV) value of 20 and Delay value of 2, 'NDIV<1:0>=0' and 'NDIV<17:2>=5 and DELAY<4:0>=2. As the value of NDIV<1:0>=0' the pre-scalar will be in 'DIV_by_4' mode all the time.

The 'FB_DLY/MODE' signal will be issued after 2 pre-scaler clock cycles after 'FB' generated by program counter.

For feedback divider value (NDIV) of 21 and Delay value of 2, 'NDIV<1:0>=1' and 'NDIV<17:2>=5 and DELAY<4:0>=2. Once program counter finishes its counting it issues 'FB' signal on the rising edge of this signal Delay Counter will start and issues a 'FB_DLY/MODE' after 2 pre-scaler clock cycles. As the value of NDIV<1:0>=1' the pre-scalar will be in 'DIV_by_5' of 5*CLK cycle only after receiving the 'FB_DLY/MODE' signal and after that the pre-scaler will switch back to 'Div_by_4' mode.

Figure 5:
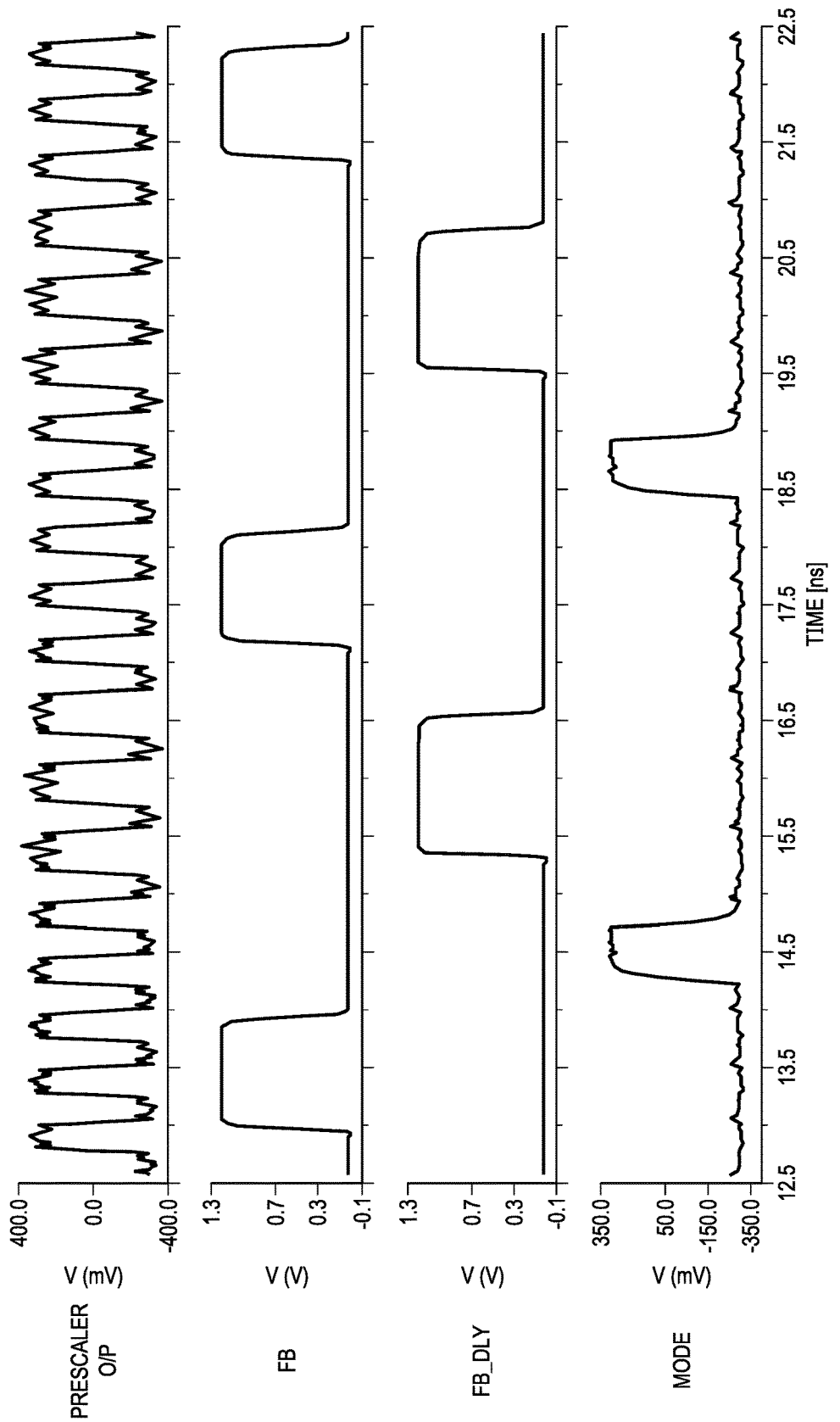
FIG. 5 illustrates example plots for prescaler, FB feedback, FB_DLY delayed feedback, and prescaler mode signals, from a delay generation circuit for generating delay feedback FB_DLY and mode control for a dual-modulus prescaler according to this disclosure.

FIG. 5 illustrates example plots for prescaler, FB feedback, FB_DLY delayed feedback, and prescaler mode signals, from a delay generation circuit for generating delay feedback FB_DLY and mode control for a dual-modulus prescaler according to this disclosure.

Advantages include: (a) Integrating the Delay Counter into the programmable Feedback divider and controlling the Pre-scalar mode (which is used to control /4 or /5) by delay counter output so as to produce fixed delay value irrespective of Divider value programmed is the novelty of this solution; (b) Pre-scalar mode (which is used to control /4 or /5) is controlled by delay cell output; (c) as the Delay circuit runs on /4 clock a Low power sequential circuit based delay chain is achieved; (d) the Delay generation block is integrated into existing feedback divider; (e) Sequential delay (synchronized with VCO clock); (f) Lower noise; (f) 4× power reduction compared to prior-art using VCO as the direct clock; (g) reduced complexity by re-using the pre-scalar for getting the VCO/4 clock; (h) timing closure becomes easy as VCO/4 clock is involved instead of direct VCO clock.

The Disclosure provided by this Description and the Figures sets forth example embodiments and applications illustrating aspects and features of the invention, and does not limit the scope of the invention, which is defined by the claims. Known circuits, connections, functions and operations are not described in detail to avoid obscuring the principles and features of the invention. These example embodiments and applications, including example design considerations, can be used by ordinarily skilled artisans as a basis for modifications, substitutions and alternatives to construct other embodiments, including adaptations for other applications.

The invention claimed is:

1. A phase locked loop (PLL) circuit, comprising:
the PLL circuit operable to generate a PLL clock signal PLL_clk with a controlled frequency;
feedback divider circuitry including:
dual modulus prescaler circuitry responsive to a divide mode input to selectively divide the PLL_clk signal by at least prescaler divide modes M and M+1 to generate a prescaled divide signal;
divider circuitry to selectively divide the prescaled divide signal to generate a feedback (FB) signal; and
delay circuitry, clocked by the prescaled divide signal, and responsive to the FB signal to initiate a delay period, and after a pre-defined delay period based on the prescaled divide signal:
to generate a delayed feedback (FB_DLY) signal, and
to generate the divide mode input;
phase frequency detection (PFD) circuitry including first and second PFD circuits responsive respectively to the FB and FB_DLY signals to generate respective first and second phase comparison signals corresponding to phase differences between a reference signal, and respectively the FB and FB_DLY signals.

2. The circuit of claim 1, wherein the prescaler divide modes are 4 and 5.

3. The circuit of claim 1, further comprising:
charge-pump circuitry responsive the first and second phase comparison signals to generate a PLL frequency control signal to control the frequency of the PLL_clk signal.

4. The circuit of claim 1, further comprising one of:
a voltage controlled oscillator (VCO); and
an interface to a VCO external to the PLL circuit;
the VCO responsive to the PLL frequency control signal to generate the PLL_clk signal.

5. The circuit of claim 1, wherein the PLL circuit is used in a PLL frequency synthesizer.

6. The circuit of claim 3, wherein
the first PFD circuit is responsive to the FB signal to generate PFD up1 and dn1 signals;
the second PFD circuit is responsive to the FB_DLY signal to generated PFD up2 and dn2 signals; and
the charge pump circuitry coupled to receive the PFD dn1 and PFD up2 signals.

7. A frequency synthesizer circuit, comprising:
a phase locked loop (PLL) circuit to generate a PLL clock signal PLL_clk with a controlled frequency;
the PLL circuit including one of:
a frequency controlled oscillator, or
an interface to a frequency controlled oscillator external to the PLL circuit;
the frequency controlled oscillator responsive to a PLL frequency control signal to generate the PLL_clk signal, and
a control loop to generate the PLL frequency control signal;
the control loop including:
frequency divider circuitry, including:
dual modulus prescaler circuitry responsive to a divide mode input to selectively divide the PLL_clk signal by at least prescaler divide modes M and M+1 to generate a prescaled divide signal;
divider circuitry to selectively divide the prescaled divide signal to generate a feedback (FB) signal; and
delay circuitry, clocked by the prescaled divide signal, ands responsive to the FB signal to initiate a delay period, and after a pre-defined delay period based on the prescaled divide signal:
to generate a delayed feedback (FB_DLY) signal, and
to generate the divide mode input;
dual phase frequency detector (PFD) circuitry including first and second PFD circuits responsive respectively to the FB and FB_DLY signals to generate respective first and second phase comparison signals corresponding to phase differences between respectively the FB and FB_DLY signals, and a reference signal.

8. The frequency synthesizer of claim 7, wherein the prescaler divide modes are 4 and 5.

9. The frequency synthesizer of claim 7, wherein the frequency controlled oscillator comprises a voltage control oscillator (VCO).

10. The frequency synthesizer of claim 7, further comprising:
charge-pump circuitry responsive the first and second phase comparison signals to generate a PLL frequency control signal to control the frequency of the PLL_clk signal.

11. The frequency synthesizer of claim 10, wherein
the first PFD circuit is responsive to the FB signal to generate PFD up1 and dn1 signals;
the second PFD circuit is responsive to the FB_DLY signal to generated PFD up2 and dn2 signals; and
the charge pump circuitry coupled to receive the PFD dn1 and PFD up2 signals.

12. A method for controlling a phase locked loop (PLL), including phase frequency detection (PFD), comprising:
generating a PLL clock signal PLL_clk with a controlled frequency based on a PLL frequency control signal;
dividing the PLL_clk signal by:
selectively dividing the PLL_clk signal with a dual modulus prescaler with at least prescaler divide modes M and M+1 based on a divide mode input, to generate a prescaled divide signal;
selectively dividing the prescaled divide signal to generate a feedback (FB) signal; and
responsive to the FB signal, initiating a pre-defined delay period, and after the delay period based on the prescaled divide signal:
generating a delayed feedback (FB_DLY) signal, and
generating the divide mode input;
based respectively on the FB and FB_DLY signals, generating first and second phase comparison signals corresponding to phase differences between respectively the FB and FB_DLY signals, and a reference signal; and
generating the PLL frequency control signal based on the first and second phase comparison signals.

13. The method of claim 12, wherein the prescaler divide modes are 4 and 5.

14. The method of claim 12, wherein the PLL_clk signal is generated by a voltage controlled oscillator (VCO) responsive to the PLL frequency control signal.

15. The method of claim 12, wherein the PLL frequency control signal is generated by a charge pump responsive the first and second phase comparison signals.

16. The method of claim 15, wherein
   the first phase comparison signal comprises PFD up1 and dn1 signals;
   the second phase comparison signal comprises PFD up2 and dn2 signals; and
   the PLL frequency control signal is based on the PFD dn1 and PFD up2 signals.

17. The method of claim 12, wherein the PLL comprises a frequency synthesizer.

\* \* \* \* \*